(12) United States Patent
Matsui et al.

(10) Patent No.: US 9,633,902 B2
(45) Date of Patent: Apr. 25, 2017

(54) METHOD FOR MANUFACTURING SEMICONDUCTOR DEVICE THAT INCLUDES DIVIDING SEMICONDUCTOR SUBSTRATE BY DRY ETCHING

(71) Applicant: KABUSHIKI KAISHA TOSHIBA, Minato-ku, Tokyo (JP)

(72) Inventors: Satoshi Matsui, Yokohama Kanagawa (JP); Mie Matsuo, Kamakura Kanagawa (JP); Chiaki Takubo, Sumida Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/843,899

(22) Filed: Sep. 2, 2015

(65) Prior Publication Data
US 2016/0268164 A1  Sep. 15, 2016

Related U.S. Application Data

(60) Provisional application No. 62/131,110, filed on Mar. 10, 2015.

(51) Int. Cl.
*H01L 21/467* (2006.01)
*H01L 21/78* (2006.01)
(Continued)

(52) U.S. Cl.
CPC .......... *H01L 21/78* (2013.01); *H01L 21/2855* (2013.01); *H01L 21/28575* (2013.01); *H01L 21/3065* (2013.01); *H01L 21/3081* (2013.01); *H01L 21/30621* (2013.01); *H01L 21/443* (2013.01); *H01L 21/467* (2013.01)

(58) Field of Classification Search
CPC ............... H01L 21/268; H01L 21/2855; H01L 21/3043; H01L 21/30604; H01L 21/30621; H01L 21/3065; H01L 21/3081; H01L 21/32051; H01L 21/32131;
(Continued)

(56) References Cited

U.S. PATENT DOCUMENTS 8,557,682 B2 * 10/2013 Holden .................. H01L 21/78
257/E21.599
9,076,860 B1 * 7/2015 Lei ..................... H01L 21/67092
(Continued)

FOREIGN PATENT DOCUMENTS

JP    2010219211 A    9/2010

*Primary Examiner* — Stephen W Smoot
(74) *Attorney, Agent, or Firm* — Holtz, Holtz & Volek PC

(57) ABSTRACT

According to an embodiment, a method for manufacturing a semiconductor device includes: selectively forming a plurality of mask layers on a first surface of a semiconductor substrate, and the semiconductor substrate having the first surface and a second surface; dividing the semiconductor substrate by forming a gap piercing from the first surface to the second surface of the semiconductor substrate, the gap being formed by dry-etching the first surface of the semiconductor substrate exposed between the plurality of mask layers, and a width of the gap on the second surface side being larger than a width of the gap on the first surface side; and forming a first electrode under a reduced-pressure atmosphere on the first surface of the semiconductor substrate after the semiconductor substrate being divided.

20 Claims, 7 Drawing Sheets

(51) Int. Cl.
*H01L 21/3065* (2006.01)
*H01L 21/308* (2006.01)
*H01L 21/306* (2006.01)
*H01L 21/285* (2006.01)
*H01L 21/443* (2006.01)

(58) Field of Classification Search
CPC ............ H01L 21/32134; H01L 21/443; H01L 21/467; H01L 21/47635; H01L 21/784
USPC .................................................. 438/113, 691
See application file for complete search history.

(56) References Cited

U.S. PATENT DOCUMENTS

| | | | |
|---|---|---|---|
| 2004/0102025 A1* | 5/2004 | Arita | H01J 37/32082 438/460 |
| 2007/0249178 A1* | 10/2007 | Ogihara | H01L 21/3065 438/753 |
| 2011/0175209 A1* | 7/2011 | Seddon | H01L 21/76898 257/659 |
| 2015/0011073 A1* | 1/2015 | Lei | H01L 21/78 438/462 |
| 2015/0069576 A1* | 3/2015 | Mariani | H01L 21/78 257/618 |

* cited by examiner

METHOD FOR MANUFACTURING SEMICONDUCTOR DEVICE THAT INCLUDES DIVIDING SEMICONDUCTOR SUBSTRATE BY DRY ETCHING

CROSS-REFERENCE TO RELATED APPLICATIONS

This application is based upon and claims the benefit of priority from U.S. Provisional Patent Application 62/131, 110, filed on Mar. 10, 2015; the entire contents of which are incorporated herein by reference.

FIELD

Embodiments described herein relate generally to a method for manufacturing a semiconductor device.

BACKGROUND

Methods for singulating a semiconductor wafer into a plurality of semiconductor devices include a method called plasma dicing. In this method, a plurality of mask layers are selectively formed on a surface of a semiconductor substrate, the semiconductor substrate exposed from the plurality of mask layers is etched by dry etching, and the semiconductor substrate is singulated.

However, when the semiconductor device includes e.g. a MOSFET (Metal Oxide Semiconductor Field Effect Transistor) or the like, and the semiconductor device has an upper electrode and a lower electrode, following subjects arise as examples.

For instance, a process for selectively removing the lower electrode on dicing lines before singulation of the semiconductor substrate is required when the lower electrode is formed on a rear surface side of the semiconductor substrate before singulation of the semiconductor substrate. Further, metal may come around to side walls of the singulated semiconductor devices and metal layers may be formed on the side walls when the lower electrode is formed on a rear surface side of the semiconductor substrate after singulation of the semiconductor substrate e.g. under a reduced-pressure atmosphere.

DETAILED DESCRIPTION

Figure 1:
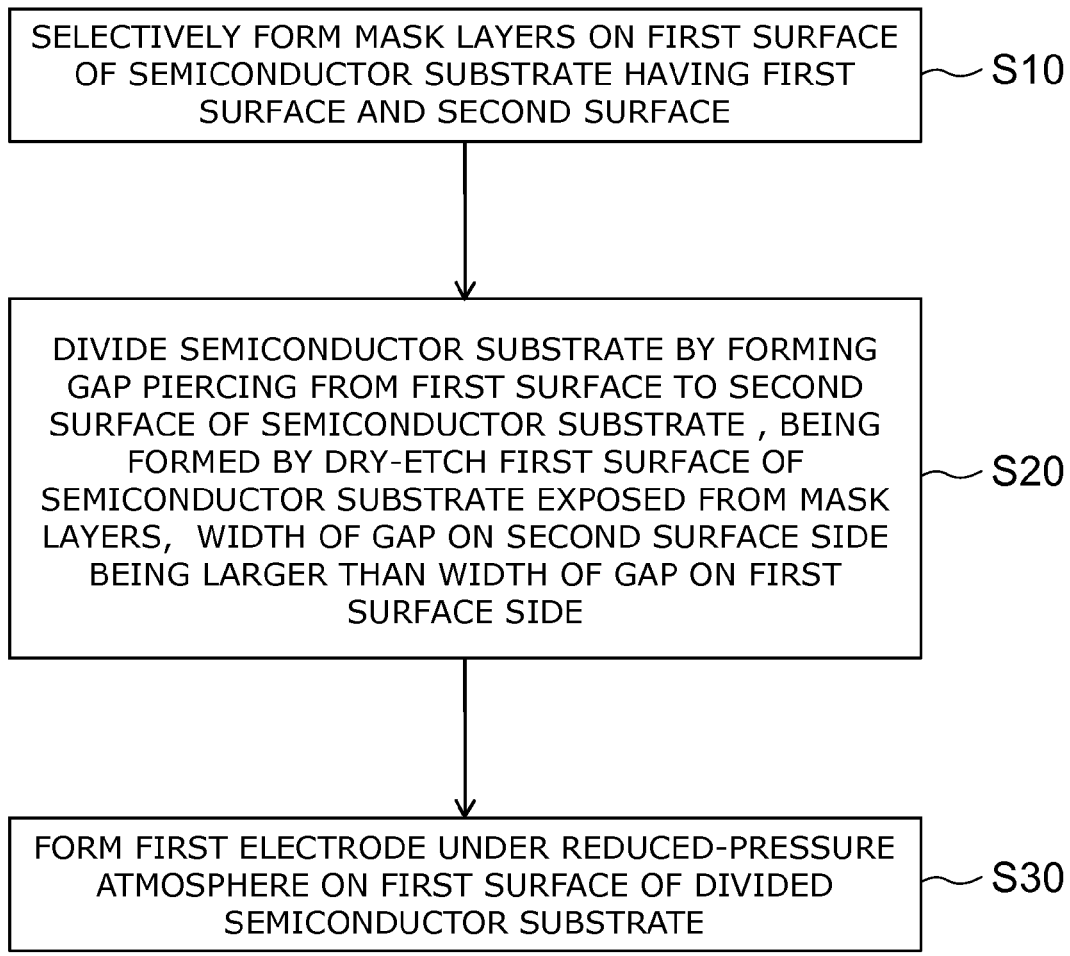
FIG. 1 is a flow showing an example of a method for manufacturing a semiconductor device according to an embodiment.

According to an embodiment, a method for manufacturing a semiconductor device includes: selectively forming a plurality of mask layers on a first surface of a semiconductor substrate, and the semiconductor substrate having the first surface and a second surface; dividing the semiconductor substrate by forming a gap piercing from the first surface to the second surface of the semiconductor substrate, the gap being formed by dry-etching the first surface of the semiconductor substrate exposed between the plurality of mask layers, and a width of the gap on the second surface side being larger than a width of the gap on the first surface side; and forming a first electrode under a reduced-pressure atmosphere on the first surface of the semiconductor substrate after the semiconductor substrate being divided.

Embodiments will now be described with reference to the drawings. In the following description, like members are labeled with like reference numerals and the description of the members once described will be appropriately omitted.

FIG. 1 is a flow showing an example of a method for manufacturing a semiconductor device according to the embodiment.

In the method for manufacturing a semiconductor device according to the embodiment, a plurality of mask layers are selectively formed on a first surface of a semiconductor substrate having the first surface and a second surface (step S10). Then, the first surface of the semiconductor substrate exposed from the plurality of mask layers is dry-etched, and the gap piercing from the first surface to the second surface of the semiconductor substrate are formed. Regarding the width of the gap, the width on the second surface side is larger than the width on the first surface side. This gap is formed, and thereby, the semiconductor substrate is divided with the gap in between (step S20). Then, a first electrode is formed on the first surface of the divided semiconductor substrate under a reduced-pressure atmosphere (step S30).

The specific method for manufacturing the semiconductor device according to the embodiment will be described.

FIGS. 2A to 4B are schematic sectional views showing an example of the method for manufacturing the semiconductor device according to the embodiment. XYZ-coordinate systems are introduced to the drawings shown in the embodiment.

Figure 2A:
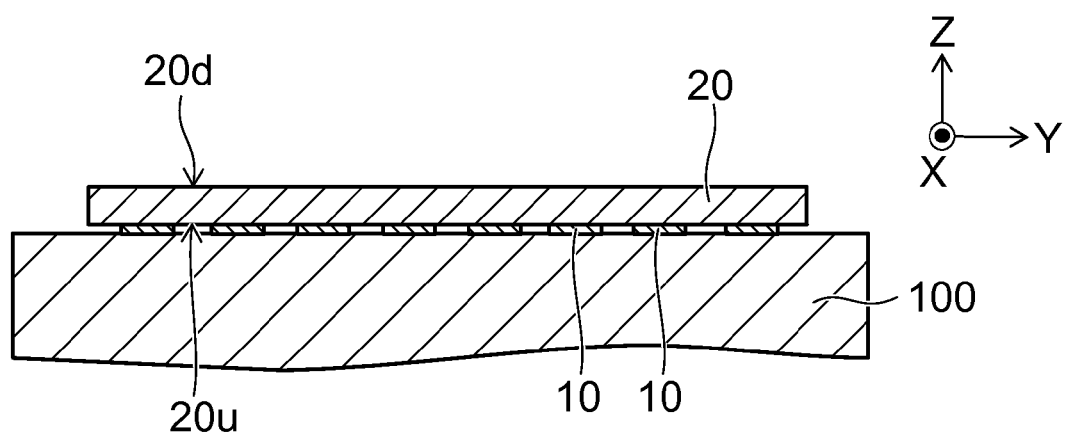
FIGS. 2A to 4B are schematic sectional views showing an example of the method for manufacturing the semiconductor device according to the embodiment.

For instance, as shown in FIG. 2A, a semiconductor substrate 20 is set on a support 100. The support 100 is e.g. a grind tape. The semiconductor substrate 20 is e.g. a semiconductor wafer. When the semiconductor substrate 20 is seen from the Z-direction, the outer shape of the semiconductor substrate 20 is a circular shape. The semiconductor included in the semiconductor substrate 20 includes one of e.g. silicon (Si), silicon carbide (SiC), gallium nitride (GaN), and gallium arsenide (GaAs).

The semiconductor substrate 20 has a first surface (hereinafter, e.g. a lower surface 20d) and a second surface (hereinafter, e.g. an upper surface 20u). The semiconductor substrate 20 is set on the support 100 with the upper surface 20u directed toward the support 100.

On the upper surface 20u side of the semiconductor substrate 20, the so-called wafer process has been performed, and e.g. at least one parts of semiconductor elements are formed. Within the semiconductor substrate 20, regions in which at least one parts of semiconductor elements are formed are referred to as "element regions".

For instance, when the semiconductor element is a MOSFET including a source region, a base region, a drift region, a drain region, a gate electrode, and a gate insulating film, the source region, the base region, the gate electrode, and the gate insulating film, etc. (hereinafter referred to as "source region etc.") are provided on the side of the upper surface 20u of the semiconductor substrate 20. Further, e.g. the drain region is provided on the side of the lower surface 20d of the semiconductor substrate 20. The drift region is provided between the drain region and the source region etc.

For instance, when the semiconductor element is an IGBT including an n-type emitter region, a p-type base region, an n-type base region, a p-type collector region, a gate electrode, and a gate insulating film, the p-type base region, the gate electrode, and the gate insulating film, etc. (hereinafter referred to as "emitter region etc.") are provided on the side of the upper surface 20u of the semiconductor substrate 20, the n-type emitter region. Further, the p-type collector region is provided on the side of the lower surface 20d of the semiconductor substrate 20. The n-type base region is provided between the p-type collector region and the n-type emitter region etc.

For instance, when the semiconductor element is a diode including a p-type region and an n-type region, the p-type region is provided on the side of the upper surface 20u of the semiconductor substrate 20. The n-type region is provided on the side of the lower surface 20d of the semiconductor substrate 20.

For instance, when the semiconductor element is a light emitting element such as an LED (Light Emitting Diode), a light emitting part and cladding layers sandwiching the light emitting part are provided on the side of the upper surface 20u of the semiconductor substrate 20.

Further, interlayer insulating films, via electrodes, interconnections, etc. may be provided on the side of the upper surface 20u of the semiconductor substrate 20. Or, passive elements such as resistors and capacitors may be provided on the side of the upper surface 20u of the semiconductor substrate 20. In the embodiment, the semiconductor substrate 20 includes not only the semiconductor elements but also the interlayer insulating films, via electrodes, interconnections, electrode pads, etc.

A plurality of second electrodes (hereinafter, e.g. upper electrodes 10) are selectively provided on the upper surface 20u of the semiconductor substrate 20. When the element is a MOSFET, the upper electrode 10 is e.g. a source electrode or a gate pad, when the element is an IGBT, e.g. an emitter electrode or a gate pad, when the element is a diode, e.g. an anode electrode, and when the element is an LED, corresponds to an upper electrode of the LED.

Figure 2B:
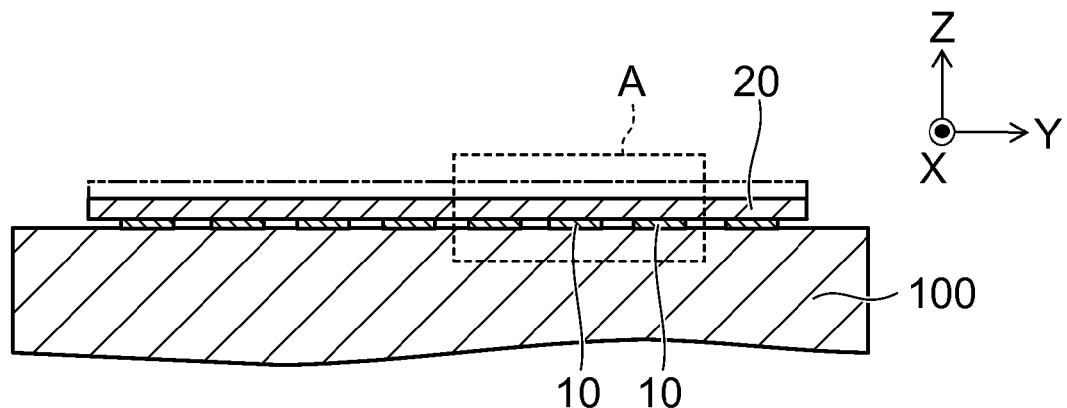

Then, as shown in FIG. 2B, the lower surface 20d of the semiconductor substrate 20 is ground by back grind or the like. Thereby, the thickness of the semiconductor substrate 20 becomes thinner. Further, on the lower surface 20d of the semiconductor substrate 20 grounded by back grind or the like, polishing such as polishing grind may be performed.

The next process will be described using a drawing in which a part surrounded by A in FIG. 2B is enlarged.

Figure 3A:
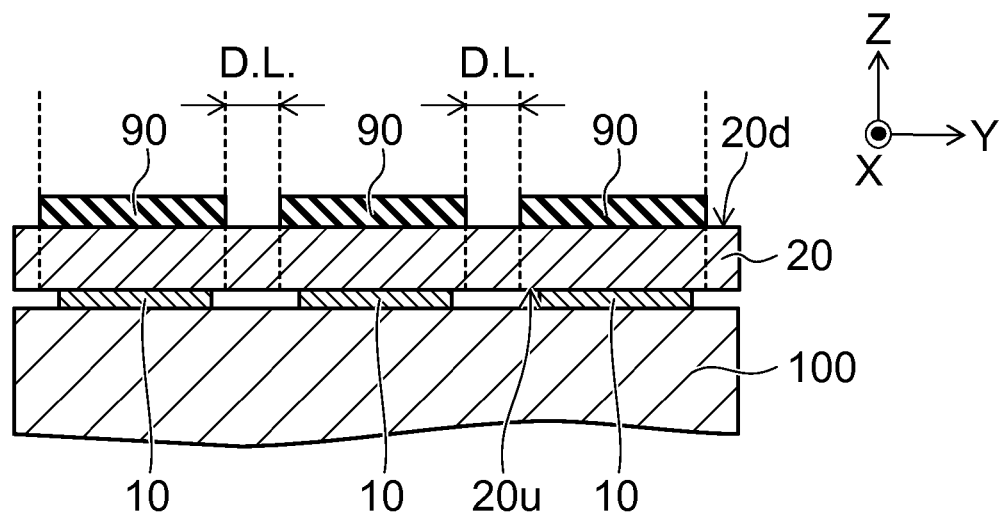

Then, as shown in FIG. 3A, a plurality of mask layers 90 are selectively formed on the lower surface 20d of the semiconductor substrate 20. The plurality of mask layers 90 are formed by e.g. PEP (Photo Engraving Process). The plurality of mask layers 90 include e.g. resists.

Each of the plurality of mask layers 90 is not formed on a dicing (dividing) line (DL) of the semiconductor substrate 20. The dicing line (DL) is a region to be removed by dicing (dividing). Therefore, the element, the interlayer insulating film, the via electrode, the interconnection, the electrode pad, etc. may be not disposed on the dicing line (DL). Further, one of the plurality of mask layers 90 is positioned on one of the plurality of upper electrodes 10 via the semiconductor substrate 20. For example, the plurality of mask layers 90 are formed so that each of the plurality of mask layers 90 may be located in a region including the upside of each of the plurality of upper electrodes 10 via the semiconductor substrate 20. The width (i.e. width in a direction crossing a direction that the dicing line (DL) extends) of the dicing line (DL) is e.g. 10 μm or less. For example, distance between adjacent mask layers 90 is 10 μm or less.

In the embodiment, the direction from the lower surface 20d to the upper surface 20u is e.g. a Z-direction and the direction intersecting with the Z-direction is e.g. an X-direction or a Y-direction. An area of the section formed by cutting of each of the plurality of upper electrodes 10 in the X-direction and the Y-direction is smaller than an area formed by cutting of each of the plurality of mask layers 90 in e.g. the X-direction and the Y-direction.

Figure 3B:
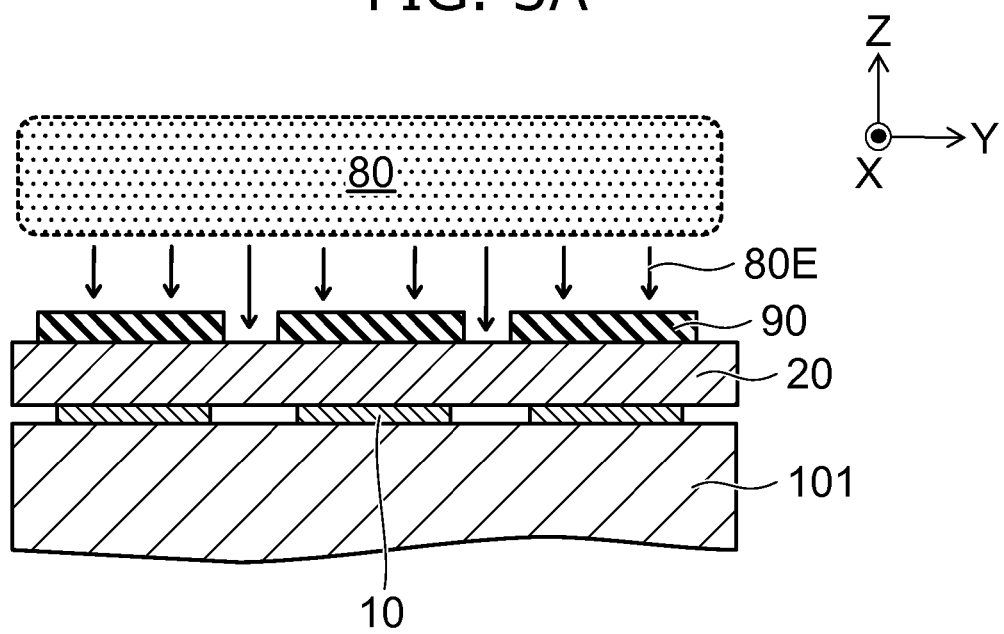

Then, as shown in FIG. 3B, the semiconductor substrate 20 with the plurality of mask layers 90 is set on a support 101 of a plasma dicing apparatus (not shown). For instance, the semiconductor substrate 20 is mounted on the support 101 with the upper surface 20u of the semiconductor substrate 20 facing toward the support 101. The support 101 is an electrostatic chuck, a metallic stage, or the like.

Then, a gas for etching is introduced into the plasma dicing apparatus, and electric discharge is performed for the etching gas. Thereby, plasma 80 is generated within the plasma dicing apparatus. The plasma 80 includes an etchant 80E etc. that can etch the semiconductor substrate 20. The lower surface 20d of the semiconductor substrate 20 exposed from the mask layers 90 is exposed to the etchant 80E etc. That is, the semiconductor substrate 20 exposed from the plurality of mask layers 90 is dry-etched from the side of the lower surface 20d of the semiconductor substrate 20.

Here, the dry etching is e.g. RIE (Reactive Ion Etching). For instance, when the plasma 80 is generated, a predetermined bias voltage (e.g. negative bias voltage) may be applied to the support 101. Or, when the plasma 80 is generated, a self-bias voltage may be applied to the support 101. Thereby, ions in the plasma 80 are accelerated toward the semiconductor substrate 20. When the ions in the plasma 80 collide with the semiconductor substrate 20, chemical reaction between the semiconductor substrate 20 and the etching gas proceed in the irradiated part of the semiconductor substrate 20 by ion irradiation. Then, etching of the semiconductor substrate 20 is progressed.

Figure 4A:
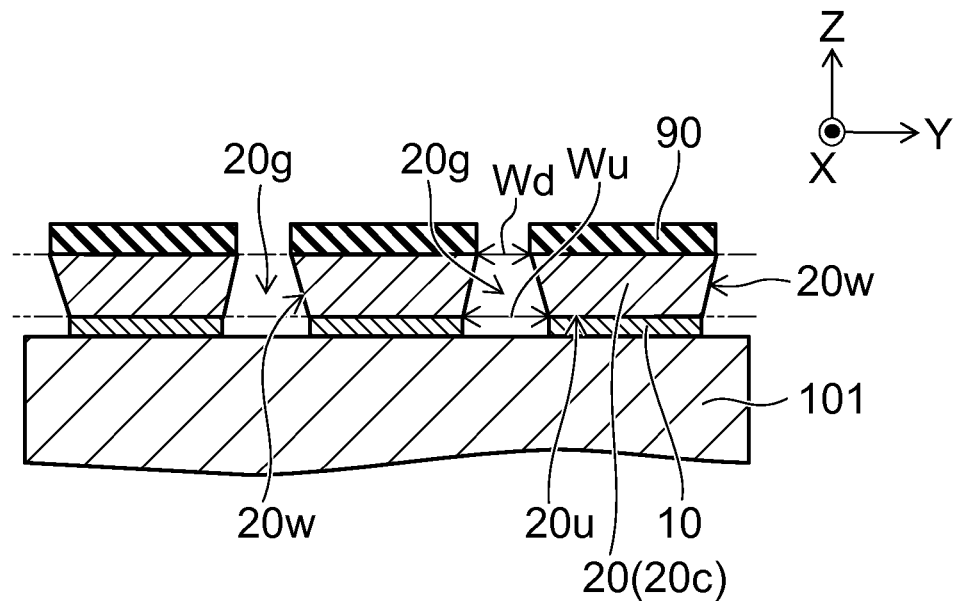

FIG. 4A shows a state after etching.

As shown in FIG. 4A, the semiconductor substrate 20 is divided into individual chip portions 20c by plasma dicing. The semiconductor substrate 20 is divided with the gap 20g. The side walls 20w of the divided semiconductor substrate 20 are slopes. The gap 20g pierces from the side of the lower surface 20d to the side of the upper surface 20u of the semiconductor substrate 20. In the embodiment, the chip portions 20c formed by singulation may also be referred to as "semiconductor substrate". For instance, the semiconductor substrate 20 before the singulation is referred to as "first semiconductor substrate" and the semiconductor substrate 20 after the singulation is referred to as "second semiconductor substrate".

The width Wu of the gap 20g on the side of the upper surface 20u is larger than the width Wd of the gap 20g on the side of the lower surface 20d. For instance, the gap 20g becomes wider from the lower surface 20d toward the upper surface 20u. Here, "width" of the gap 20g is a distance between the adjacent semiconductor substrates 20 after division in the X-direction or the Y-direction.

When the semiconductor substrate 20 is dry-etched, a gas mixture of a first gas (etching gas) and a second gas (deposition gas) may be used. The first gas (etching gas) can etch the semiconductor substrate 20, and the second gas (deposition gas) can form films having elements included in the semiconductor substrate 20 (e.g. oxide films or the like) on the side walls 20w of the gap 20g may be used. The first gas includes e.g. $SF_6$ and $CF_4$. The second gas includes $O_2$, $SiF_4$, and $C_4F_8$.

For instance, electric discharge is performed for the gas mixture of the first gas and the second gas at the same time. Then, the etching of the semiconductor substrate 20 by the etching gas is put in competition with the formation of the films on the side walls 20w of the gap 20g by the deposition gas and the dry etching of the semiconductor substrate 20 is progressed.

For instance, the dry etching is progressed by promotion of the etching of the semiconductor substrate 20 by the etching gas ahead of the formation of the films on the side walls 20w of the gap 20g by the deposition gas. For instance, the gap 20g wider from the lower surface 20d toward the upper surface 20u is formed by appropriate adjustment of a ratio between the partial pressure of the first gas and the partial pressure of the second gas. As one example, by the control of the partial pressure of the first gas to be higher than the partial pressure of the second gas, the gap 20g wider from the lower surface 20d toward the upper surface 20u may be formed.

Figure 4B:
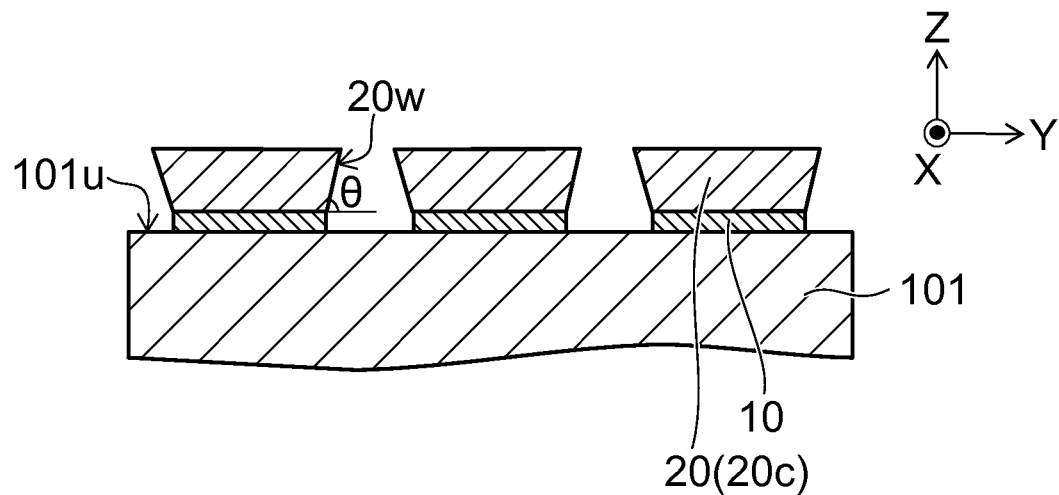

Then, as shown in FIG. 4B, the mask layers 90 are removed. Here, an angle θ formed by the side wall 20w of the chip portion 20c and an upper surface 101u of the support 101 is less than e.g. 90°. The upper surface 101u of the support 101 is flat. For instance, if the angle A formed by the side wall 20w of the chip portion 20c and the upper surface 101u of the support 101 is 90° or more, it is not favorable that the metal is likely to come around to the side wall of the chip portion 20c when the lower electrode is formed as will be described later.

Figure 5:
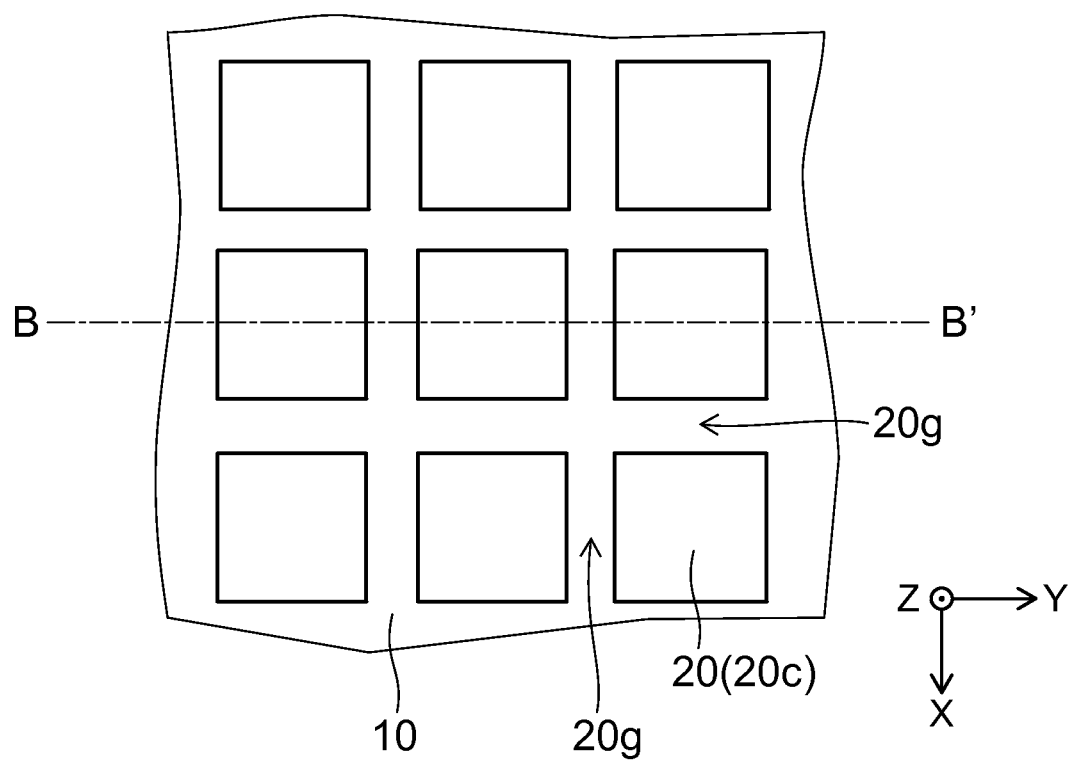
FIG. 5 is a schematic plan view showing one example of the method for manufacturing the semiconductor device according to the embodiment.

FIG. 5 is a schematic plan view showing one example of the method for manufacturing the semiconductor device according to the embodiment.

FIG. 5 schematically shows a state after etching of the semiconductor substrate 20 as seen from the Z-direction. For instance, the semiconductor substrate 20 is divided with the gap 20g in the X-direction or the Y-direction. Each divided chip portion 20c is surrounded by the gap 20g. Note that FIG. 4B shows the section along line B-B' shown in FIG. 5.

Figure 6A:
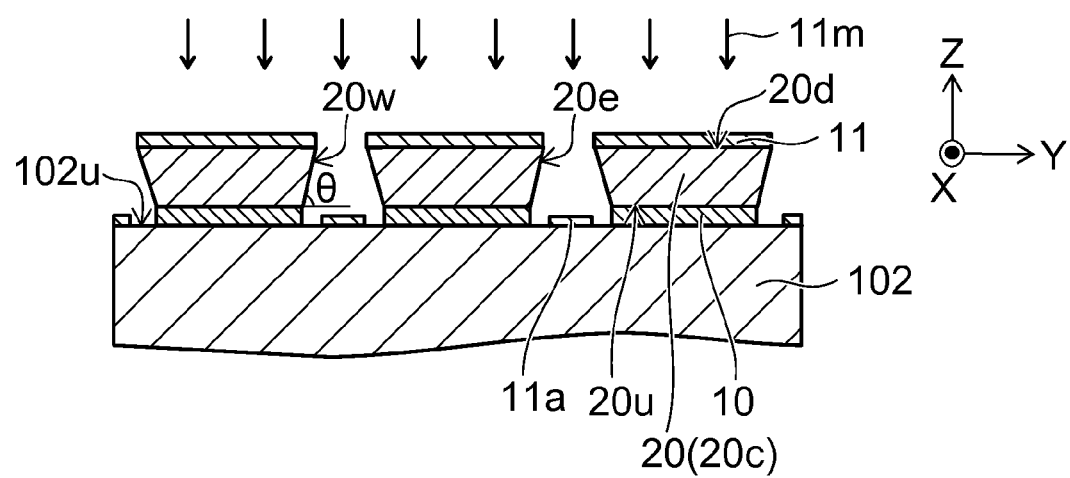
FIGS. 6A and 6B are schematic sectional views showing one example of the method for manufacturing the semiconductor device according to the embodiment.
Figure 6B:
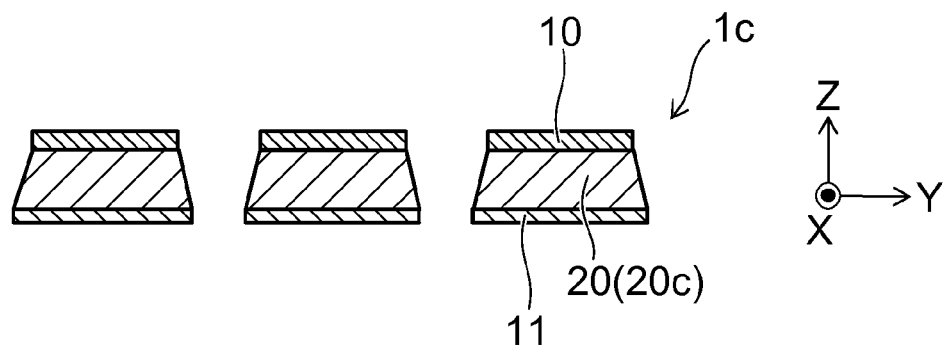

FIGS. 6A and 6B are schematic sectional views showing one example of the method for manufacturing the semiconductor device according to the embodiment.

As shown in FIG. 6A, the divided semiconductor substrate 20 is mounted on a support 102, facing the plurality of upper electrodes 10 toward the support 102. The first electrode (hereinafter, e.g. lower electrode 11) is formed on the lower surface 20d of the divided semiconductor substrate 20 (chip portion 20c) under a reduced-pressure atmosphere. Here, an upper surface 102u of the support 102 is flat. For instance, by sputtering under the reduced-pressure atmosphere, the lower electrode 11 is formed on the lower surface 20d. The support 102 is e.g. a metallic stage or a ceramic stage including interconnects.

Here, the sputtering is an anisotropic deposition method. For instance, during the formation of the lower electrode 11, the direction of a metal 11m from a target (not shown) toward the lower surface 20d of the semiconductor substrate 20 (chip portion 20c) is in parallel or substantially in parallel to the Z-direction. Further, a bias voltage (e.g. negative bias voltage) may be applied to the support 102 during the formation of the lower electrode 11 to further preferentially increase the metal 11m flying in parallel to the Z-direction.

The metal 11m flying in parallel or substantially in parallel to the Z-direction reaches the lower surface 20d of the chip portion 20c and the support 102 between the adjacent chip portions 20c. Thereby, a metal film 11a is formed on the support 102. However, the angle A formed by the side wall 20w of the chip portion 20c and the upper surface 102u of the support 102 is less than e.g. 90°. Therefore, an end 20e on the lower surface 20d side of the chip portion 20c serves as an eave, thus, the metal 11m does not come around to the side wall 20w of the chip portion 20c. That is, the lower electrode 11 is not formed on the side wall 20w of the chip portion 20c.

The lower electrode formed on the lower surface 20d of the semiconductor substrate 20 (chip portion 20c) corresponds to e.g. a drain electrode when the element is a MOSFET, corresponds to e.g. a collector electrode when the element is an IGBT, corresponds to e.g. a cathode electrode when the element is a diode, and corresponds to e.g. a lower electrode of the LED when the element is an LED.

Then, as shown in FIG. 6B, each chip portion 20c is picked up from the support 102 and the upside of each chip portion 20c is turned down. Thereby, a semiconductor device 1c including the upper electrode 10, the lower electrode 11, and the semiconductor substrate 20 (chip portion 20c) without the lower electrode 11 on the side walls 20w is obtained. The semiconductor device 1c may be referred to as "semiconductor chip".

The method for singulating the semiconductor substrate includes dicing using a dicing blade. However, in the method, the width of the dicing line should be set to be not less than the width of the dicing blade (50 μm or more). Therefore, it is impossible to set the width of the dicing line to be less than the width of the dicing blade. Further, cracking may occur in the side wall of the semiconductor substrate due to contact between the dicing blade and the side wall of the semiconductor substrate. Because of that, it is impossible to dispose the element region close to the side wall of the semiconductor substrate. That is, according to the method, it is difficult to increase the occupied area of the element region.

On the other hand, in the embodiment, as the method for singulating the semiconductor substrate 20, plasma dicing without using the dicing blade is employed. According to the method, the width of the dicing blade may be set to be no more than the width of the dicing blade. For instance, the width of the dicing line may be set to be 10 μm or less as one example. Further, the dicing blade is not used, and thus, cracking is harder to occur in the side wall 20w of the semiconductor substrate 20 (chip portion 20c). Thereby, the element region may be disposed close to the side wall 20w of the chip portion 20c. That is, according to the embodiment, the occupied area of the element region increases. In other words, according to the embodiment, the number of semiconductor devices that can be extracted from one semiconductor wafer increases.

Here, there is a method for singulating the semiconductor substrate by plasma dicing after forming the lower electrode on the entire lower surface of the semiconductor substrate as the method for singulating the semiconductor substrate. In the method, a mask layer is patterned on the lower electrode before plasma dicing, and the lower electrode exposed from the mask layer is first removed by etching. The etched regions are to be diced by plasma dicing. Then, a mask layer for exposure of the diced regions is patterned again on the lower surface of the semiconductor substrate. Then, the semiconductor substrate exposed from the mask layer is etched by plasma. However, according to the method, the patterning process (mask layer formation and etching) of the lower electrode formed on the entire lower surface of the semiconductor substrate is required before plasma dicing, and the manufacturing cost rises.

On the other hand, in the embodiment, the semiconductor substrate 20 is singulated by plasma dicing, and then, the lower electrode 11 is formed on the lower surface of the semiconductor substrate 20. Therefore, the patterning process of the lower electrode before plasma dicing may be omitted. Thereby, the manufacturing cost becomes lower. Further, in the embodiment, regarding the gap 20g between the adjacent chip portions 20c, the width Wu on the upper surface 20u side is larger than the width Wd on the lower surface 20d side. Accordingly, the lower electrode 11 is not formed on the side walls 20w of the chip portion 20c.

For instance, if the lower electrode 11 is formed on the side walls 20w of the chip portion 20c, e.g. a bonding material such as solder may spread on the side walls 20w when the semiconductor device 1c is mounted on a printed circuit board or a lead frame. If the lower electrode 11 and the bonding material are formed on the side walls 20w of the chip portion 20c, stress may be applied to the chip portion 20c due to the difference in thermal expansion between the metal and the semiconductor and the chip portion 20c may be deteriorated. Alternatively, the semiconductor device 1c may be peeled off more easily from the printed circuit board or the lead frame. According to the embodiment, those defects are suppressed.

The method for forming the gap 20g having the width Wu on the upper surface 20u side larger than the width Wd on the lower surface 20d side is not limited to the above described method.

Figure 7A:
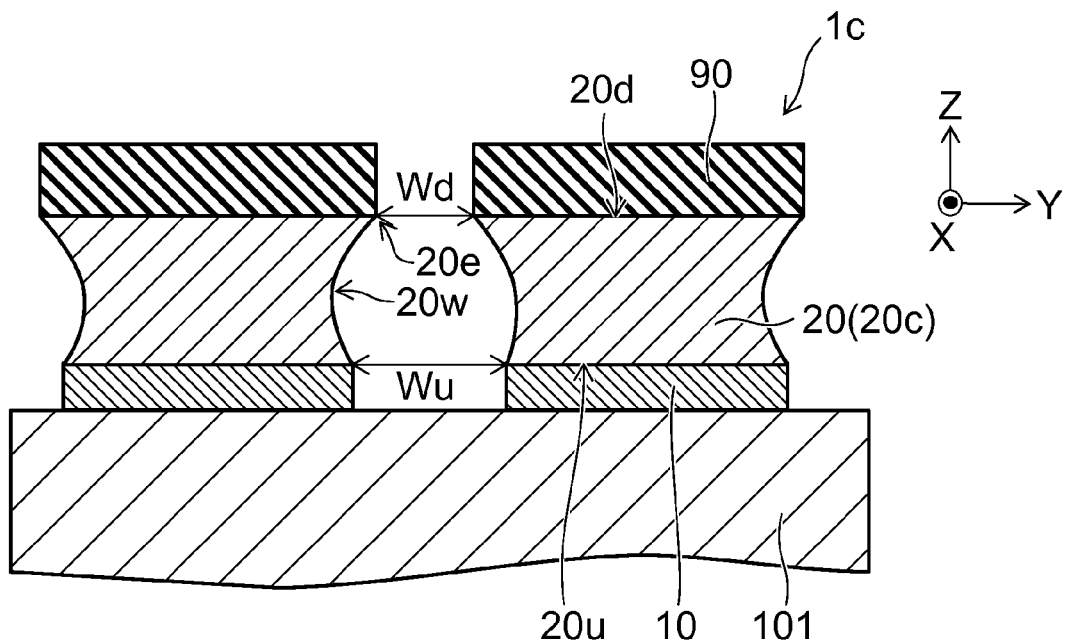
FIGS. 7A and 7B are schematic sectional views showing examples of a method for manufacturing a semiconductor device according to another embodiment.
Figure 7B:
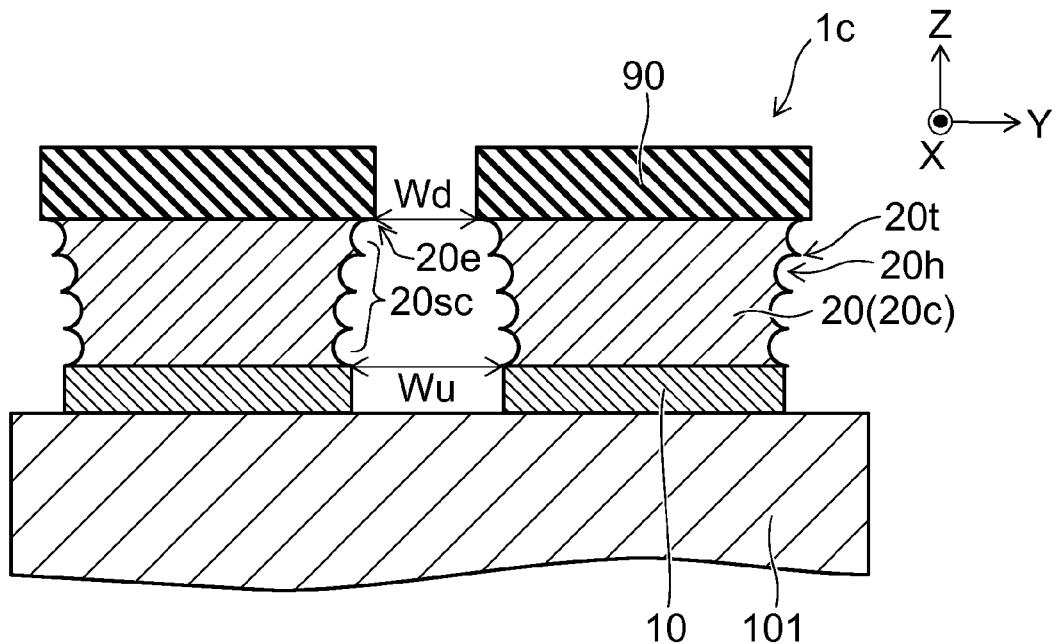

FIGS. 7A and 7B are schematic sectional views showing examples of a method for manufacturing a semiconductor device according to another the embodiment.

For instance, as a first example, dry etching during plasma dicing may include the function of isotropic etching. According to the first example method, the etchant 80E in the plasma 80 spreads not only in the Z-direction but also in the X-direction and the Y-direction. Therefore, after the plasma dicing, as shown in FIG. 7A, the side walls 20w of the semiconductor substrate 20 (chip portion 20c) are e.g. curved surfaces.

Also, in the structure illustrated in FIG. 7A, the gap 20g having the width Wu on the upper surface 20u side larger than the width Wd on the lower surface 20d side is formed, and the end 20e on the lower surface 20d side of the chip portion 20c serves as an eave and the metal does not come around to the side wall 20w of the chip portion 20c. That is, the lower electrode 11 is not formed on the side wall 20w of the chip portion 20c.

Further, as a second example, in the dry etching during plasma dicing, the semiconductor substrate 20 may be alternately exposed to a discharged first gas (etching gas) and a discharged second gas (deposition gas). Here, for instance, the time when the semiconductor substrate 20 is exposed to the discharged first gas is set to be longer than the time when the semiconductor substrate 20 is exposed to the discharged second gas.

Thereby, e.g. ridge portions 20t in ridge shapes and groove portions 20h grooved in curved surfaces are formed on the side walls 20w of the chip portion 20c after the plasma dicing. FIG. 7B shows the state. In the second example, the so-called scalloped surface 20sc in which the ridge portions 20t and the groove portions 20h are alternately repeated in the Z-direction is formed as the side wall 20w of the chip portion 20c.

Also, in the structure illustrated in FIG. 7B, the gap 20g having the width Wu on the upper surface 20u side larger than the width Wd on the lower surface 20d side is formed, and the end 20e on the lower surface 20d side of the chip portion 20c serves as an eave and the metal does not come around to the side wall 20w of the chip portion 20c. That is, the lower electrode 11 is not formed on the side wall 20w of the chip portion 20c.

As above, the embodiment has been described with reference to the specific examples. However, the embodiment is not limited to the specified examples. That is, the scope of the embodiment includes the specific examples with design changes appropriately made by a person skilled in the art as long as they have the features of the embodiment. The respective elements of the respective specific examples, their arrangements, materials, conditions, shapes, sizes, etc. are not limited to those illustrated but may be appropriately changed.

Further, the above described respective elements of the respective embodiments may be combined as much as technically possible and the scope of the embodiment includes the combinations as long as they have the features of the embodiment. In addition, it would be understood that a person skilled in the art may achieve various modified examples and altered examples within the spirit of the embodiment and these modified examples and altered examples may belong to the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device comprising:
    selectively forming a plurality of mask layers on a first surface of a semiconductor substrate, the semiconductor substrate having the first surface and a second surface;
    dividing the semiconductor substrate by forming a gap piercing from the first surface to the second surface of the semiconductor substrate, the gap being formed by dry-etching the first surface of the semiconductor substrate exposed between the plurality of mask layers, and a width of the gap on the second surface side being larger than a width of the gap on the first surface side; and
    forming a first electrode under a reduced-pressure atmosphere on the first surface of the semiconductor substrate after the semiconductor substrate is divided.

2. The method according to claim 1, wherein the width of the gap becomes larger from the first surface toward the second surface.

3. The method according to claim 1, wherein the first electrode is formed on the first surface by sputtering.

4. The method according to claim 3, wherein the first electrode is formed on the first surface by the sputtering while a bias voltage is applied to the semiconductor substrate.

5. The method according to claim 1, further comprising:
forming a plurality of second electrodes on the second surface side of the semiconductor substrate before the plurality of mask layers are formed.

6. The method according to claim 5, wherein one of the plurality of mask layers is positioned above a corresponding one of the plurality of second electrodes via the semiconductor substrate.

7. The method according to claim 5, wherein an area of a section formed by cutting of one of the plurality of second electrodes in a direction crossing a direction from the first surface toward the second surface is smaller than an area formed by cutting of one of the plurality of mask layers in the direction crossing the direction from the first surface toward the second surface.

8. The method according to claim 1, wherein a gas mixture of a first gas and a second gas is used when the semiconductor substrate is dry-etched, the first gas being capable of etching the semiconductor substrate, and the second gas being capable of forming a film having an element included in the semiconductor substrate on a side wall of the gap.

9. The method according to claim 8, wherein electric discharge is performed for the first gas and the second gas at the same time when the semiconductor substrate is dry-etched.

10. The method according to claim 8, wherein a partial pressure of the first gas is different from a partial pressure of the second gas when the semiconductor substrate is dry-etched.

11. The method according to claim 10, wherein the partial pressure of the first gas is higher than the partial pressure of the second gas when the semiconductor substrate is dry-etched.

12. The method according to claim 8, wherein the semiconductor substrate is alternately exposed to the first gas and the second gas when the semiconductor substrate is dry-etched.

13. The method according to claim 8, wherein the first gas includes $SF_6$ and $CF_4$, and the second gas includes $O_2$, $SiF_4$, and $C_4F_8$.

14. The method according to claim 1, wherein a semiconductor element or a part of the semiconductor element is formed on the second surface side of the semiconductor substrate before the plurality of mask layers are formed.

15. The method according to claim 1, wherein a side surface of the semiconductor substrate after being divided is curved.

16. The method according to claim 1, wherein a side surface of the semiconductor substrate after being divided has ridge portions and groove portions.

17. The method according to claim 16, wherein the ridge portions and the groove portions are alternately arranged in a direction from the first surface toward the second surface.

18. The method according to claim 1, wherein a side wall of the semiconductor substrate after being divided is surrounded by the gap.

19. The method according to claim 1, wherein the semiconductor substrate is mounted on a support before forming the first electrode, and an angle formed by a side wall of the semiconductor substrate and an upper surface of the support is less than 90°.

20. The method according to claim 1, wherein a distance between adjacent mask layers of the plurality of mask layers is 10 μm or less.

* * * * *